(12) United States Patent
Wang et al.

(10) Patent No.: US 12,198,620 B2
(45) Date of Patent: Jan. 14, 2025

(54) OLED DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Wei Wang, Hubei (CN); Qing Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/758,135

(22) PCT Filed: May 13, 2022

(86) PCT No.: PCT/CN2022/092729
§ 371 (c)(1),
(2) Date: Jun. 29, 2022

(87) PCT Pub. No.: WO2023/197396
PCT Pub. Date: Oct. 19, 2023

(65) Prior Publication Data
US 2024/0194132 A1  Jun. 13, 2024

(30) Foreign Application Priority Data
Apr. 14, 2022  (CN) .......................... 202210413579.9

(51) Int. Cl.
*G09G 3/3233* (2016.01)
*H10K 59/121* (2023.01)
*H10K 59/35* (2023.01)

(52) U.S. Cl.
CPC ....... *G09G 3/3233* (2013.01); *H10K 59/1216* (2023.02); *H10K 59/35* (2023.02);
(Continued)

(58) Field of Classification Search
CPC ......... G09G 3/3233; G09G 2300/0426; G09G 2300/0452; G09G 2300/0819;
(Continued)

(56) References Cited

U.S. PATENT DOCUMENTS

2017/0169764 A1  6/2017 Lee et al.
2019/0187844 A1* 6/2019 Ye .......................... G06F 3/0445
(Continued)

FOREIGN PATENT DOCUMENTS

CN      1917015 A     2/2007
CN     206003477 U    3/2017
(Continued)

OTHER PUBLICATIONS

Chinese Office Action issued in corresponding Chinese Patent Application No. 202210413579.9 dated Mar. 15, 2023, pp. 1-9.
(Continued)

*Primary Examiner* — Patrick N Edouard
*Assistant Examiner* — Joseph P Fox
(74) *Attorney, Agent, or Firm* — PV IP PC; Wei Te Chung

(57) ABSTRACT

In an OLED display panel provided by the present application, a capacitance value of a first capacitor corresponding to a sub-pixel circuit of at least one color is different from a capacitance value of the first capacitor corresponding to a sub-pixel circuit of another one color in red sub-pixel circuits, green sub-pixel circuits, and blue sub-pixel circuits, so that a capacitance value of the first capacitor corresponding to the green sub-pixel circuits is greatest; in the red sub-pixel circuits, the green sub-pixel circuits, and the blue
(Continued)

sub-pixel circuits, a capacitance value of the first capacitor corresponding to the blue sub-pixel circuit is least.

18 Claims, 4 Drawing Sheets

(52) U.S. Cl.
CPC ............... *G09G 2300/0426* (2013.01); *G09G 2300/0452* (2013.01); *G09G 2300/0819* (2013.01); *G09G 2300/0852* (2013.01); *G09G 2320/02* (2013.01)

(58) Field of Classification Search
CPC ....... G09G 2300/0852; G09G 2320/02; G09G 3/3208; G09G 2320/0233; H10K 59/1216; H10K 59/35; H10K 59/1213
See application file for complete search history.

(56) References Cited

U.S. PATENT DOCUMENTS

| | | | |
|---|---|---|---|
| 2022/0044634 A1* | 2/2022 | Ka | G09G 3/3258 |
| 2023/0419893 A1* | 12/2023 | Wang | G09G 3/3233 |

FOREIGN PATENT DOCUMENTS

| | | |
|---|---|---|
| CN | 107452771 A | 12/2017 |
| CN | 108122500 A | 6/2018 |
| CN | 109786425 A | 5/2019 |
| CN | 112037715 A | 12/2020 |
| CN | 212256866 U | 12/2020 |
| CN | 112700749 A | 4/2021 |
| CN | 113314039 A | 8/2021 |
| CN | 113314071 A | 8/2021 |
| CN | 114067749 A | 2/2022 |
| CN | 114220839 A | 3/2022 |

OTHER PUBLICATIONS

International Search Report in International application No. PCT/CN2022/092729, mailed on Nov. 29, 2022.
Written Opinion of the International Search Authority in International application No. PCT/CN2022/092729, mailed on Nov. 29, 2022.

* cited by examiner

V32>V31>V33

OLED DISPLAY PANEL

FIELD OF INVENTION

The present application relates to the technical field of display, and especially to an OLED display panel.

BACKGROUND OF INVENTION

An organic light emitting diode (OLED) display panel comprises a plurality of sub-pixels, and the plurality of sub-pixels comprise red sub-pixels, green sub-pixels, and blue sub-pixels. Each sub-pixel is driven by a sub-pixel circuit, and the sub-pixel circuit is configured to drive a light-emitting device to emit light. Because efficiency and turn-on voltages of the red sub-pixels, the green sub-pixels, and the blue sub-pixels are different, the green sub-pixels are prone to a light leakage phenomenon under a black screen, while the blue sub-pixels do not easily reach preset brightness under a high brightness screen. Based on this, the red sub-pixels, the green sub-pixels, and the blue sub-pixels display nonuniformly in existing OLED display panels.

SUMMARY OF INVENTION

The present application provides an OLED display panel, which can prevent a light leakage phenomenon of green sub-pixels from arising under a black screen, and/or can make blue sub-pixels reach preset brightness under a high brightness screen, thereby improving display quality of the OLED display panel.

The present application provides the OLED display panel, which comprises a plurality of sub-pixel circuits, the sub-pixel circuit is configured to drive a light-emitting device to emit light; the plurality of sub-pixel circuits comprise red sub-pixel circuits, green sub-pixel circuits, and blue sub-pixel circuits; wherein, the sub-pixel circuit comprises a first transistor, a second transistor, a first capacitor, and a second capacitor; the first transistor is configured to control a current flowing through the light-emitting device; a first end of the first capacitor is electrically connected with a gate electrode of the first transistor; and a second end of the first capacitor is electrically connected with a first control signal terminal; a gate electrode of the second transistor is electrically connected with the first control signal terminal; one of a source electrode and a drain electrode of the second transistor is electrically connected with a data signal terminal, and another one of the source electrode and the drain electrode of the second transistor is electrically connected with one of a source electrode and a drain electrode of the first transistor; a first end of the second capacitor is electrically connected with a first power supply, and a second end of the second capacitor is electrically connected with the gate electrode of the first transistor; and in the red sub-pixel circuits, the green sub-pixel circuits, and the blue sub-pixel circuits, a capacitance value of the first capacitor corresponding to the sub-pixel circuit of at least one color is different from the capacitance value of the first capacitor corresponding to the sub-pixel circuit of another one color.

In the OLED display panel provided by the present application, a capacitance value of the first capacitor corresponding to the red sub-pixel circuit is smaller than or equal to a capacitance value of the first capacitor corresponding to the green sub-pixel circuit, and the capacitance value of the first capacitor corresponding to the red sub-pixel circuit is larger than or equal to a capacitance value of the first capacitor corresponding to the blue sub-pixel circuit.

In the OLED display panel provided by the present application, the first capacitor comprises a first electrode plate, a second electrode plate, and a dielectric layer disposed between the first electrode plate and the second electrode plate;

the OLED display panel comprises a substrate, a first conductive channel layer, a first insulating layer, a first gate layer, a second insulating layer, a second gate layer, a third insulating layer, and a second conductive channel layer which are stacked in sequence;

wherein a first gate layer comprises a gate electrode and the first electrode plate, the dielectric layer comprises the first insulating layer and the second insulating layer, the second conductive channel layer comprises conductive channels and the second electrode plate.

In the OLED display panel provided in the present application, overlapping area of orthographic projections of the first electrode plate and the second electrode plate corresponding to the first capacitor corresponding to the at least one color sub-pixel circuit on the substrate is different from the overlapping area of the orthographic projections of the first electrode plate and the second electrode plate corresponding to the first capacitor corresponding to the another one color sub-pixel circuit on the substrate.

In the OLED display panel provided in the present application, an overlapping area of orthographic projections of the first electrode plate and the second electrode plate corresponding to the first capacitor corresponding to the red sub-pixel circuit on the substrate is smaller than or equal to an overlapping area of orthographic projections of the first electrode plate and the second electrode plate corresponding to the first capacitor corresponding to the green sub-pixel circuit on the substrate. The overlapping area of the orthographic projections of the first electrode plate and the second electrode plate corresponding to the first capacitor corresponding to the red sub-pixel circuit on the substrate is larger than or equal to an overlapping area of orthographic projections of the first electrode plate and the second electrode plate corresponding to the first capacitor corresponding to the blue sub-pixel circuit on the substrate.

In the OLED display panel provided in the present application, line widths of the first electrode plate and the second electrode plate corresponding to the first capacitor corresponding to the red sub-pixel circuit are smaller than or equal to line widths corresponding to the first electrode plate and the second electrode plate corresponding to the first capacitor corresponding to the green sub-pixel circuit. The line widths of the first electrode plate and the second electrode plate corresponding to the first capacitor corresponding to the red sub-pixel circuit are larger than or equal to line widths of the first electrode plate and the second electrode plate corresponding to the first capacitor corresponding to the blue sub-pixel circuit.

In the OLED display panel provided in the present application, the sub-pixel circuit further comprises a third transistor, a fourth transistor, a fifth transistor, a sixth transistor, and a seventh transistor;

a gate electrode of the third transistor is electrically connected with a second control signal terminal, one of a source electrode and a drain electrode of the third transistor is electrically connected with the gate electrode of the first transistor, and another one of the source electrode and the drain electrode of the third transistor is electrically connected with another one of the source electrode and the drain electrode of the first transistor;

a gate electrode of the fourth transistor is electrically connected with a third control signal terminal, and one of a source electrode and a drain electrode of the fourth transistor is electrically connected with the first power supply, and another one of the source electrode and the drain electrode of the fourth transistor is electrically connected with one of the source electrode and the drain electrode of the first transistor;

a gate electrode of the fifth transistor is electrically connected with the third control signal terminal, and one of a source electrode and a drain electrode of the fifth transistor connects with another one of the source electrode and the drain electrode of the first transistor, another one of the source electrode and the drain electrode of the fifth transistor is electrically connected with an anode of the light-emitting device, and a cathode of the light-emitting device is electrically connected with a second power supply;

a gate electrode of the sixth transistor is electrically connected with a fourth control signal terminal, one of a source electrode and a drain electrode of the sixth transistor is electrically connected with a first initialization power supply, and another one of the source electrode and the drain electrode of the sixth transistor is electrically connected with the gate electrode of the first transistor;

a gate electrode of the seventh transistor is electrically connected with the first control signal terminal, one of a source electrode and a drain electrode of the seventh transistor is electrically connected with a second initialization power supply, and another one of the source electrode and the drain electrode of the seventh transistor is electrically connected with the anode of the light-emitting device;

wherein the first electrode plate extends along a first direction, the second electrode plate extends along a second direction, and the first direction intersects with the second direction;

the first electrode plate and gate electrode of the seventh transistor are both first electrode block, and one of the source electrode and the drain electrode of the third transistor and another one of the source electrode and the drain electrode of the sixth transistor are both second electrode block; the gate electrode of the first transistor is a third electrode block, the second electrode plate is a fourth electrode block, and the gate electrode of the second transistor is a fifth electrode block; and the first electrode block is electrically connected with the fifth electrode block, and the second electrode block, the third electrode block, and the fourth electrode block are electrically connected.

In the OLED display panel provided in the present application, the first electrode block and the fifth electrode block are disposed at interval along the first direction, and the fourth electrode block and the second electrode block are disposed at interval along the first direction.

In the OLED display panel provided in the present application, the second electrode block has a same shape as the fourth electrode block.

In the OLED display panel provided in the present application, a thickness of the dielectric layer corresponding to the first capacitor corresponding to the sub-pixel circuit of at least one color is different from a thickness of the dielectric layer corresponding to the first capacitor corresponding to the sub-pixel circuit of another one color.

In the OLED display panel provided in the present application, a thickness of the dielectric layer corresponding to the first capacitor corresponding to the red sub-pixel circuit is larger than or equal to a thickness of the dielectric layer corresponding to the first capacitor corresponding to the green sub-pixel circuit. The thickness of the dielectric layer corresponding to the first capacitor corresponding to the red sub-pixel circuit is smaller than or equal to a thickness of the dielectric layer corresponding to the first capacitor corresponding to the blue sub-pixel circuit.

In the OLED display panel provided in the present application, a dielectric constant of the dielectric layer corresponding to the first capacitor corresponding to the sub-pixel circuit of at least one color is different from a dielectric constant of the dielectric layer corresponding to the first capacitor corresponding to the sub-pixel circuit of another one color.

In the OLED display panel provided in the present application, a dielectric constant of the dielectric layer corresponding to the first capacitor corresponding to the red sub-pixel circuit is smaller than or equal to a dielectric constant of the dielectric layer corresponding to the first capacitor corresponding to the green sub-pixel circuit. The dielectric constant of the dielectric layer corresponding to the first capacitor corresponding to the red sub-pixel circuit is larger than or equal to a dielectric constant of the dielectric layer corresponding to the first capacitor corresponding to the blue sub-pixel circuit.

In the OLED display panel provided in the present application, the sub-pixel circuit further comprises a third transistor, a fourth transistor, and a fifth transistor;

a gate electrode of the third transistor is electrically connected with a second control signal terminal, one of a source electrode and a drain electrode of the third transistor is electrically connected with the gate electrode of the first transistor, and another one of the source electrode and the drain electrode of the third transistor is electrically connected with another one of the source electrode and the drain electrode of the first transistor;

a gate electrode of the fourth transistor is electrically connected with a third control signal terminal, and one of a source electrode and a drain electrode of the fourth transistor is electrically connected with the first power supply, and another one of the source electrode and the drain electrode of the fourth transistor is electrically connected with another one of the drain electrode and the drain electrode of the first transistor;

a gate electrode of the fifth transistor is electrically connected with the third control signal terminal, and one of a source electrode and a drain electrode of the fifth transistor connects with another one of the source electrode and the drain electrode of the first transistor, another one of the source electrode and the drain electrode of the fifth transistor is electrically connected with the anode of the light-emitting device, and a cathode of the light-emitting device is electrically connected with a second power supply.

In the OLED display panel provided in the present application, the sub-pixel circuit further comprises a sixth transistor and a seventh transistor;

agate electrode of the sixth transistor is electrically connected with a fourth control signal terminal, one of a source electrode and a drain electrode of the sixth transistor is electrically connected with a first initialization power supply, and another of the source electrode and the drain electrode of the sixth transistor is electrically connected with the gate electrode of the first transistor;

a gate electrode of the seventh transistor is electrically connected with the first control signal terminal, one of a source electrode and a drain electrode of the seventh transistor is electrically connected with a second initialization power supply, and another one of the source electrode and the drain electrode is electrically connected with the anode of the light-emitting device.

In the OLED display panel provided in the present application, the first transistor, the second transistor, the fourth transistor, the fifth transistor, and the seventh transistor are all P-type transistors, the third transistor and the sixth transistor are all N-type transistors.

The present application also provides an OLED display panel, which comprises a plurality of sub-pixel circuits, the sub-pixel circuit is configured to drive a light-emitting device to emit light; the plurality of sub-pixel circuits comprise red sub-pixel circuits, green sub-pixel circuits, and blue sub-pixel circuits; wherein the sub-pixel circuit comprises a first transistor, a second transistor, a first capacitor and a second capacitor; the first transistor is configured to control current flowing through the light-emitting device; a first end of the first capacitor is electrically connected with a gate electrode of the first transistor; and a second end of the first capacitor is electrically connected with a first control signal terminal; a gate electrode of the second transistor is electrically connected with a first control signal terminal; one of a source electrode and a drain electrode of the second transistor is electrically connected with a data signal terminal; another one of the source electrode and the drain electrode of the second transistor is electrically connected with one of a source electrode and a drain electrode of the first transistor; a first end of the second capacitor is electrically connected with a first power supply, and a second end of the second capacitor is electrically connected with the gate electrode of the first transistor; and in the red sub-pixel circuits, the green sub-pixel circuits, and the blue sub-pixel circuits, a capacitance value of the first capacitor corresponding to the sub-pixel circuit of at least one color is different from the capacitance value of the first capacitor corresponding to the sub-pixel circuit of another one color;

a capacitance value of the first capacitor corresponding to the red sub-pixel circuit is smaller than or equal to a capacitance value of the first capacitor corresponding to the green sub-pixel circuit, and the capacitance value of the first capacitor corresponding to the red sub-pixel circuit is larger than or equal to a capacitance value of the first capacitor corresponding to the blue sub-pixel circuit; the first capacitor comprises a first electrode plate, a second electrode plate, and a dielectric layer disposed between the first electrode plate and the second electrode plate;

the OLED display panel comprises a substrate, a first conductive channel layer, a first insulating layer, a first gate layer, a second insulating layer, a second gate layer, a third insulating layer, and a second conductive channel layer which are stacked in sequence;

wherein the first gate layer comprises a gate electrode and the first electrode plate, the dielectric layer comprises the first insulating layer and the second insulating layer, the second conductive channel layer comprises conductive channels and the second electrode plate.

In the OLED display panel provided in the present application, overlapping area of orthographic projection of the first electrode plate and the second electrode plate corresponding to the first capacitor corresponding to the at least one color sub-pixel circuit on the substrate is different from the overlapping area of the orthographic projections of the first electrode plate and the second electrode plate corresponding to the first capacitor corresponding to the another one color sub-pixel circuit on the substrate.

In the OLED display panel provided in the present application, an overlapping area of the orthographic projections of the first electrode plate and the second electrode plate corresponding to the first capacitor corresponding to the red sub-pixel circuit on the substrate is smaller than or equal to an overlapping area of the orthographic projections of the first electrode plate and the second electrode plate corresponding to the first capacitor corresponding to the green sub-pixel circuit on the substrate. The overlapping area of the orthographic projections of the first electrode plate and the second electrode plate corresponding to the first capacitor corresponding to the red sub-pixel circuit on the substrate is larger than or equal to an overlapping area of the orthographic projections of the first electrode plate and the second electrode plate corresponding to the first capacitor corresponding to the blue sub-pixel circuit on the substrate.

In the OLED display panel provided in the present application, line widths of the first electrode plate and the second electrode plate corresponding to the first capacitor corresponding to the red sub-pixel circuit are smaller than or equal to the line widths corresponding to the first electrode plate and the second electrode plate corresponding to the first capacitor corresponding to the green sub-pixel circuit. The line widths of the first electrode plate and the second electrode plate corresponding to the first capacitor corresponding to the red sub-pixel circuit are larger than or equal to the line widths of the first electrode plate and the second electrode plate corresponding to the first capacitor corresponding to the blue sub-pixel circuit.

In the OLED display panel provided in the present application, the sub-pixel circuit further comprises a third transistor, a fourth transistor, a fifth transistor, a sixth transistor, and a seventh transistor;

a gate electrode of the third transistor is electrically connected with a second control signal terminal, one of a source electrode and a drain electrode of the third transistor is electrically connected with the gate electrode of the first transistor, and another one of the source electrode and the drain electrode of the third transistor is electrically connected with the another one of the source electrode and the drain electrode of the first transistor;

a gate electrode of the fourth transistor is electrically connected with a third control signal terminal, and one of a source electrode and a drain electrode of the fourth transistor is electrically connected with the first power supply, and another one of the source electrode and the drain electrode of the fourth transistor is electrically connected with the another one of the source electrode and the drain electrode of the first transistor;

a gate electrode of the fifth transistor is electrically connected with the third control signal terminal, and one of a source electrode and a drain electrode of the fifth transistor connects with another one of the source electrode and the drain electrode of the first transistor, another one of the source electrode and drain electrode of the fifth transistor is electrically connected with an anode of the light-emitting device, and a cathode of the light-emitting device is electrically connected with a second power supply;

a gate electrode of the sixth transistor is electrically connected with a fourth control signal terminal, one of a source electrode and a drain electrode of the sixth transistor is electrically connected with a first initialization power supply, and another one of the source electrode and the drain electrode of the sixth transistor is electrically connected with the gate electrode of the first transistor;

a gate electrode of the seventh transistor is electrically connected with the first control signal terminal, one of a source electrode and a drain electrode of the seventh transistor is electrically connected with second initialization power supply, and another one of the source electrode and drain electrode of the seventh transistor is electrically connected with the anode of the light-emitting device;

wherein the first electrode plate extends along a first direction, the second electrode plate extends along a second direction, the first direction intersects with the second direction;

the first electrode plate and the gate electrode of the seventh transistor are both first electrode block, and one of the source electrode and the drain electrode of the third transistor and another one of the source electrode and drain electrode of the sixth transistor are both second electrode block, the gate electrode of the first transistor is third electrode block, the second electrode plate is a fourth electrode block, and the gate electrode of the second transistor is a fifth electrode block; and the first electrode block is electrically connected with the fifth electrode block, the second electrode block, and the third electrode block, and the fourth electrode block are electrically connected.

In the OLED display panel provided in the present application, the first electrode block and the fifth electrode block are disposed at interval along the first direction, the fourth electrode block and the second electrode block are disposed at interval along the first direction.

In the OLED display panel provided in the present application, the second electrode block has a same shape as the fourth electrode block.

The OLED display panel provided in this application, in the red sub-pixel circuit, the green sub-pixel circuit, and the blue sub-pixel circuit, the capacitance value of the first capacitor corresponding to the sub-pixel circuit of at least one color of is different from the capacitance value of the first capacitor corresponding to the sub-pixel circuit of another one color, so that the capacitance value of the first capacitor corresponding to the green sub-pixel circuit is greatest; and/or, in the red sub-pixel circuit, the green sub-pixel circuit, and the blue sub-pixel circuit, the capacitance value of the first capacitor corresponding to the blue sub-pixel circuit is least, so as to avoid light leakage phenomenon from the green sub-pixel under black screen; and/or, the blue sub-pixel can reach preset brightness in the high brightness screen, thereby improving display quality of the OLED display panel.

BRIEF DESCRIPTION OF DRAWINGS

In order to more clearly illustrate technical solutions in embodiments of the present application, accompanying drawings that need to be used in the description of the embodiments will be briefly introduced below. Obviously, the drawings in the following description are only some embodiments of the present application, for those skilled in the art, other drawings can also be obtained from these drawings without creative effort.

DETAILED DESCRIPTION OF PREFERRED EMBODIMENTS

Figure 1:
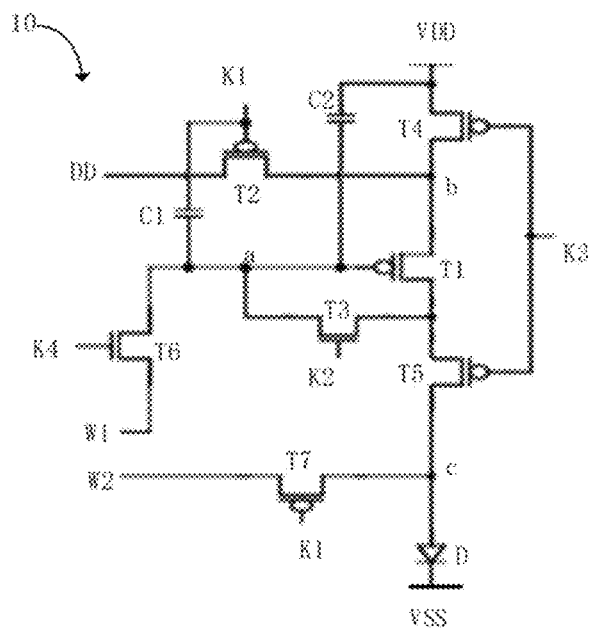
FIG. 1 is a schematic circuit diagram of a sub-pixel circuit of an OLED display panel provided by an embodiment of the present application.

The technical solutions in the embodiments of the present application will be clearly and completely described below with reference to the drawings in the embodiments of the present application. Obviously, the described embodiments are only a part of the embodiments of the present application, but not all of the embodiments. Based on the embodiments in the present application, all other embodiments obtained by those skilled in the art without creative work fall within the protection scope of the present application.

In addition, terms "first", "second", "third", "fourth", "fifth", "sixth", "seventh" in the description and claims of the present application and the above-mentioned drawings etc. are used to distinguish different objects, not to describe specific order. The terms "comprising", "having" and any variations thereof are intended to cover non-exclusive inclusion.

It should be noted that, since a source electrode and a drain electrode of a transistor used in the present application are symmetrical, the source electrode and the drain electrode thereof are interchangeable. In the embodiments of the present application, in order to distinguish two electrodes of the transistor except for a gate electrode, one electrode is called the source electrode, and another one electrode is called the drain electrode.

An OLED display panel provided by the embodiment of the present application comprises a plurality of sub-pixels. Each sub-pixel comprises a light-emitting device. Each sub-pixel is driven by a sub-pixel circuit. The sub-pixel circuit is configured to drive the light-emitting device to emit light. Wherein the plurality of sub-pixels comprise red sub-pixels, green sub-pixels, and blue sub-pixels. The red sub-pixel comprises a red light-emitting device, the green sub-pixel comprises a green light-emitting device, and the blue sub-pixel comprises a blue light-emitting device. The red sub-pixel is driven by the red sub-pixel circuit, the green sub-pixel is driven by the green sub-pixel circuit, and the blue sub-pixel is driven by the blue sub-pixel circuit. The red sub-pixel circuit is configured to drive the red light-emitting device to emit light. The green sub-pixel circuit is configured to drive the green light-emitting device to emit light. The blue sub-pixel circuit is configured to drive the blue light-emitting device to emit light. It should be noted that the light-emitting device may be a mini light-emitting diode, a micro light-emitting diode, or an organic light-emitting diode.

In existing OLED display panels, because efficiency and turn-on voltages of red sub-pixels, green sub-pixels, and blue sub-pixels are different, the green sub-pixels are prone to a light leakage phenomenon under a black screen; under a high brightness screen, the blue sub-pixels do not easily reach preset brightness. Based on this, display quality of the existing OLED display panels is poor.

Compared with the prior art, in the OLED display panel provided by the embodiment of the present application, by differentially setting capacitors in the sub-pixel circuits that affect light emission of the light-emitting devices, the light leakage phenomenon of the green sub-pixels under a black screen is thus prevented; and/or, the blue sub-pixels can reach the preset brightness under the high brightness screen, so that the display quality of the OLED display panel can be improved.

Specifically, please refer to FIG. 1, FIG. 1 is a schematic circuit diagram of a sub-pixel circuit of an OLED display panel provided by an embodiment of the present application. As shown in FIG. 1, the sub-pixel circuit 10 comprises a first transistor T1, a second transistor T2, a third transistor T3, a fourth transistor T4, a fifth transistor T5, a sixth transistor T6, a seventh transistor T7, a first capacitor C1, and a second capacitor C2. It should be noted that the sub-pixel circuit 10 may be the red sub-pixel circuit, the green sub-pixel circuit, or the blue sub-pixel circuit.

Wherein a gate electrode of the first transistor T1 is electrically connected with a first node a, one of a source electrode and a drain electrode of the first transistor T1 is electrically connected with a second node b, and another one of the source electrode and the drain electrode of the first transistor T1 is electrically connected with a third node c. The first transistor T1 is configured to control currents flowing through a light-emitting device D.

Wherein a gate electrode of the second transistor T2 is electrically connected with a first control signal terminal K1, one of a source electrode and a drain electrode of the second transistor T2 is electrically connected with a data signal terminal DD, and another one of the source electrode and the drain electrode of the second transistor T2 is electrically connected with the second node b. The second transistor T2 is configured to output signals received from the data signal terminal DD to the second node b under a control of signals received from the first control signal terminal K1.

Wherein a gate electrode of the third transistor T3 is electrically connected with a second control signal terminal K2, one of a source electrode and a drain electrode of the third transistor T3 is electrically connected with the third node c, and another one of the source electrode and the drain electrode of the third transistor T3 is electrically connected with the first node a. The third transistor T3 is configured to conduct the third node c with the first node a under the control of signals received from the second control signal terminal K2.

Wherein a gate electrode of the fourth transistor T4 is electrically connected with a third control signal terminal K3, one of a source electrode and a drain electrode of the fourth transistor T4 is electrically connected with a first power supply VDD, and another one of the source electrode and the drain electrode of the fourth transistor T4 is electrically connected with the second node b. The fourth transistor T4 is configured to output voltages supplied by the first power supply VDD to the second node b under the control of signals received from the third control signal terminal K3.

Wherein a gate electrode of the fifth transistor T5 is electrically connected with the third control signal terminal K3, one of a source electrode and a drain electrode of the fifth transistor T5 is electrically connected with the third node c, i.e. connected to an anode of the light-emitting device D, and the other one of the source electrode and the drain electrode of the fifth transistor T5 is electrically connected with one of the source electrode and the drain electrode of the third transistor T1. A cathode of the light-emitting device D is electrically connected with a second power supply VSS. The fifth transistor T5 is configured to conduct the third node c with the anode of the light-emitting device D under the control of signals received from the third control signal terminal K3.

Wherein a gate electrode of the sixth transistor T6 is electrically connected with a fourth control signal terminal K4, one of a source electrode and a drain electrode of the sixth transistor T6 is electrically connected with a first initialization power supply W1, and another one of the source electrode and the drain electrode of the sixth transistor T6 is electrically connected with the first node a.

Wherein a gate electrode of the seventh transistor T7 is electrically connected with the first control signal terminal K1, one of a source electrode and a drain electrode of the seventh transistor T7 is electrically connected with a second initialization power supply W2, and the other one of the source electrode and the drain electrode of the seventh transistor T7 is electrically connected with the third node c, i.e. connected to the anode of the light-emitting device D. The seventh transistor T7 is configured to output voltages supplied by the second initialization power supply W2 to the anode of the light-emitting device D under the control of signals received from the first control signal terminal K1.

Wherein a first end of the first capacitor C1 is electrically connected with the first node a, and a second end of the first capacitor C1 is electrically connected with the first control signal terminal K1.

Wherein a first end of the second capacitor C2 is electrically connected with the first power supply, and a second end of the second capacitor C2 is electrically connected with the first node a.

In the embodiment of the present application, both the first power supply VDD and the second power supply VSS are used to output a preset voltage value. In addition, in the embodiment of the present application, a voltage value output by the first power supply VDD is larger than a voltage value output by the second power supply VSS. Specifically, the voltage value output by the second power supply VSS may be a potential of a ground terminal. Of course, it can be understood that the voltage value output by the second power supply VSS can also be other.

Figure 2:
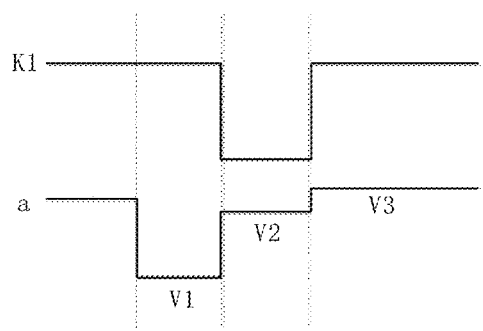
FIG. 2 is a schematic illustration diagram of a first capacitor affecting light emission of a light-emitting device.

In the embodiment of the present application, a capacitor in the sub-pixel circuit 10 that affects the light emission of the light-emitting device D is the first capacitor C1. Specifically, please refer to FIG. 2, FIG. 2 is a schematic illustration diagram of the first capacitor affecting the light emission of the light-emitting device. How the first capacitor C1 affects the light-emitting device D to emit light will be described below in combination with FIG. 1 and FIG. 2.

In addition, the transistors used in the embodiment of the present application may comprise P-type transistors and/or N-type transistors. Wherein the P-type transistor is turned on when the gate electrode is at low level, and turned off when the gate electrode is at high level. The N-type transistor is turned on when the gate electrode is at high level, and turned off when the gate electrode is at low level. In the embodiment of the present application, the first transistor T1, the second transistor T2, the fourth transistor T4, the fifth transistor T5, and the seventh transistor T7 are all the P-type transistors. The third transistor T3 and the sixth transistor T6 are both the N-type transistors.

As shown in combination with FIG. 1 and FIG. 2, first, the sixth transistor T6 is turned on under the control of the signals received from the fourth control signal terminal K4, and a voltage supplied by the first initialization power supply W1 is output to the first node a via the sixth transistor T6, so that a potential of the first node a is the voltage supplied by the first initialization power supply W1. That is, at this time, a potential of the gate electrode of the first transistor T1 is reset to the voltage supplied by the first initialization power supply W1, and at this time, the potential of the gate electrode of the first transistor T1 is a first potential V1. At a same time, the first transistor T1 is turned on.

Next, the second transistor T2 is turned on under the control of the signals received from the first control signal terminal K1, and the third transistor T3 is turned on under the control of the signals received from the second control signal terminal K2, and the signals received from the data signal terminal DD is output to the first node a via the second transistor T2, the first transistor T1, and the third transistor T3, so that the signals received from the data signal terminal DD are written to the second capacitor C2. That is, at this time, the potential of the gate electrode of the first transistor T1 is a second potential V2. It should be noted that at this time, a potential of the signals received from the first control signal terminal K1 is low potential.

Finally, the second transistor T2 is turned off under the control of the signals received from the first control signal terminal K1. That is, at this time, the potential of the signals received from the first control signal terminal K1 jumps from low potential to high potential. Since the first control signal terminal K1 is electrically connected with the second end of the first capacitor C1, when the signals received from the control signal terminal K1 jump from low potential to high potential, a potential at the second end of the first capacitor C1 also jumps from low potential to high potential. Due to a capacitive coupling effect, the potential of the second end of the first capacitor C1 will also be raised to a certain extent, so that the potential of the gate electrode of the first transistor T1 is a third potential V3, and a magnitude of a current that drives the light-emitting device D to emit light is finally determined by the third potential V3. A magnitude of the third potential V3 is related to a capacitance value of the first capacitor C1.

Therefore, based on the different efficiency and turn-on voltages of the red sub-pixels, the green sub-pixels, and the blue sub-pixels, the embodiment of the present application can prevent the light leakage phenomenon of the green sub-pixels under the black screen by differentially setting the first capacitor C1 in the sub-pixel circuit 10 that affects the light emission of the light-emitting device D, and/or can make the blue sub-pixels reach the preset brightness under the high brightness screen, thereby improving the display quality of the OLED display panel. Wherein, in the red sub-pixel circuits, the green sub-pixel circuits, and the blue sub-pixel circuits, a capacitance value of the first capacitor corresponding to the sub-pixel circuit of at least one color is different from a capacitance value of the first capacitor corresponding to the sub-pixel circuit of another one color.

Wherein a capacitance value of the first capacitor corresponding to the red sub-pixel circuit is smaller than or equal to a capacitance value of the first capacitor corresponding to the green sub-pixel circuit, and the capacitance value of the first capacitor corresponding to the red sub-pixel circuit is larger than or equal to a capacitance value of the first capacitor corresponding to the blue sub-pixel circuit.

That is, based on the light leakage phenomenon of the green sub-pixels in the black screen, the embodiment of the present application sets the capacitance value of the first capacitor C1 corresponding to the green sub-pixel circuit to a maximum value in the red sub-pixel circuit, the green sub-pixel circuit, and the blue sub-pixel circuit, so that the light leakage phenomenon of the green sub-pixels in the black screen can be prevented, thereby improving the display quality of the OLED display panel.

That is, based on that the blue sub-pixel fails to reach the preset brightness in the high brightness screen, the embodiment of the present application sets the capacitance value of the first capacitor C1 corresponding to the blue sub-pixel circuit to a minimum value in the red sub-pixel circuit, the green sub-pixel circuit, and the blue sub-pixel circuit, so that the blue sub-pixel can reach the preset brightness in the high brightness screen, thereby improving the display quality of the OLED display panel.

Figure 3:
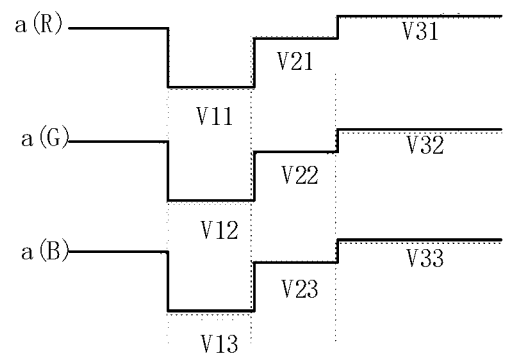
FIG. 3 is a first schematic illustration diagram of potentials of first nodes corresponding to a red sub-pixel circuit, a green sub-pixel circuit, and a blue sub-pixel circuit in the OLED display panel provided by an embodiment of the present application.
Figure 4:
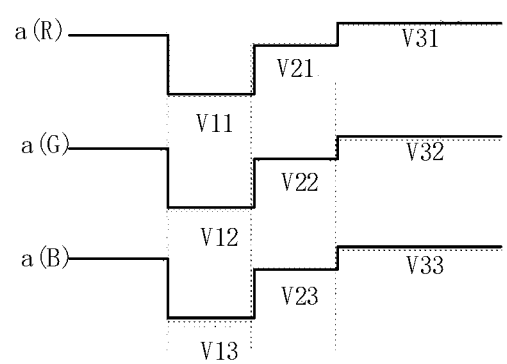
FIG. 4 is a second schematic illustration diagram of the potentials of the first nodes corresponding to the red sub-pixel circuit, the green sub-pixel circuit, and the blue sub-pixel circuit in the OLED display panel provided by an embodiment of the present application.

In one embodiment, in the red sub-pixel circuit, the green sub-pixel circuit, and the blue sub-pixel circuit, the capacitance value of the first capacitor C1 corresponding to the red sub-pixel circuit is equal to the capacitance value of the first capacitor C1 corresponding to the blue sub-pixel circuit, and the capacitance value of the first capacitor C1 corresponding to the green sub-pixel circuit is greatest. Please refer to FIG. 3, which is a first schematic illustration diagram of potentials of the first nodes corresponding to the red sub-pixel circuit, the green sub-pixel circuit, and the blue sub-pixel circuit in the OLED display panel provided by the embodiment of the present application. Combined with FIG. 1 and FIG. 4, since in the red sub-pixel circuit, the green sub-pixel circuit, and the blue sub-pixel circuit, the capacitance value of the first capacitor C1 corresponding to the red sub-pixel circuit is equal to the capacitance value of the first capacitor C1 corresponding to the blue sub-pixel circuit, and the capacitance value of the first capacitor C1 corresponding to the green sub-pixel circuit is greatest, so a third potential V31 of the first node a(R) corresponding to the red sub-pixel circuit is equal to a third potential V33 of the first node a(B) corresponding to the blue sub-pixel circuit, and a third potential V32 of the first node a(G) corresponding to the green sub-pixel circuit is relatively great, so that the light leakage phenomenon of the green sub-pixels under the black screen can be prevented, thereby improving the display quality of the OLED display panel.

In one embodiment, in the red sub-pixel circuit, the green sub-pixel circuit, and the blue sub-pixel circuit, the capacitance value of the first capacitor C1 corresponding to the red sub-pixel circuit is equal to the capacitance value of the first capacitor C1 corresponding to the green sub-pixel circuit, and the capacitance value of the first capacitor C1 corresponding to the blue sub-pixel circuit is least. Please refer to FIG. 4, which is a second schematic illustration diagram of the potentials of the first nodes corresponding to the red sub-pixel circuit, the green sub-pixel circuit, and the blue sub-pixel circuit in the OLED display panel provided by the embodiment of the present application. Combined with FIG. 1 and FIG. 4, since in the red sub-pixel circuit, the green sub-pixel circuit, and the blue sub-pixel circuit, the capacitance value of the first capacitor C1 corresponding to the red sub-pixel circuit is equal to the capacitance value of the first capacitor C1 corresponding to the green sub-pixel circuit, and the capacitance value of the first capacitor C1 corresponding to the blue sub-pixel circuit is least, so the third potential V31 of the first node a(R) corresponding to the red sub-pixel circuit is equal to the third potential V32 of the first node a(R) corresponding to the green sub-pixel circuit, and the third potential V33 of the first node a(B) corresponding to the blue sub-pixel circuit is relatively small, so that the blue sub-pixels can reach the preset brightness in the high brightness screen, thereby improving the display quality of the OLED display panel.

Figure 5:
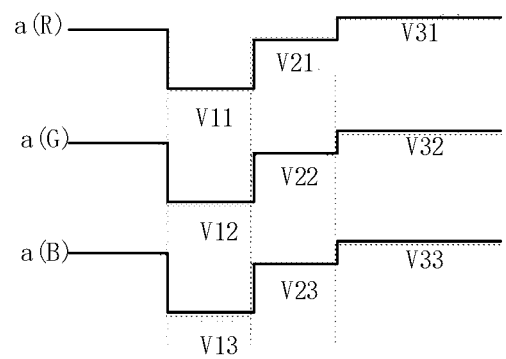
FIG. 5 is a third schematic illustration diagram of the potentials of the first nodes corresponding to the red sub-pixel circuit, the green sub-pixel circuit, and the blue sub-pixel circuit in the OLED display panel provided by an embodiment of the present application.

In one embodiment, in the red sub-pixel circuit, the green sub-pixel circuit, and the blue sub-pixel circuit, the capacitance value of the first capacitor C1 corresponding to the green sub-pixel circuit is larger than the capacitance value of the first capacitor C1 corresponding to the red sub-pixel circuit, and the capacitance value of the first capacitor C1 corresponding to the red sub-pixel circuit is larger than the capacitance value of the first capacitor C1 corresponding to the blue sub-pixel circuit. Please refer to FIG. 5, which is a third schematic illustration diagram of the potentials of the first nodes corresponding to the red sub-pixel circuit, the green sub-pixel circuit, and the blue sub-pixel circuit in the OLED display panel provided by the embodiment of the present application. Combined with FIG. 1 and FIG. 5, in the red sub-pixel circuit, the green sub-pixel circuit, and the blue sub-pixel circuit, the capacitance value of the first capacitor C1 corresponding to the green sub-pixel circuit is larger than the capacitance value of the first capacitor C1 corresponding to the red sub-pixel circuit, and the capacitance value of the capacitor C1 corresponding to the red sub-pixel circuit is larger than the capacitance value of the first capacitor C1 corresponding to the blue sub-pixel circuit, so the third potential V32 of the first node a(G) corresponding to the green sub-pixel circuit is larger than the third potential V31 of the first node a(R) corresponding to the red sub-pixel circuit, and the third potential value V31 of the first node a(R) corresponding to the red sub-pixel circuit is larger than the third potential value V33 of the first node a(B) corresponding to the blue sub-pixel circuit, and thus the light leakage phenomenon of the green sub-pixels in the black screen can be prevented, and the blue sub-pixels can reach the preset brightness in the high brightness screen, thereby improving the display quality of the OLED display panel.

Figure 6:
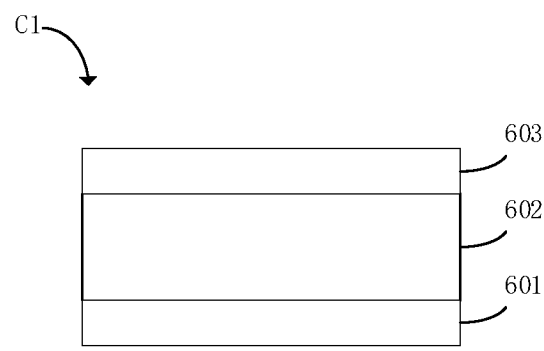
FIG. 6 is a schematic structural diagram of the first capacitor in the sub-pixel circuit shown in FIG. 1.

Please refer to FIG. 6, FIG. 6 is a schematic structural diagram of the first capacitor in the sub-pixel circuit shown in FIG. 1. Combined with FIG. 1 and FIG. 6, the first capacitor C1 comprises a first electrode plate 601, a second electrode plate 603, and a dielectric layer 602 disposed between the first electrode plate 601 and the second electrode plate 603. In the embodiment of the present application, an overlapping area of an orthographic projection of the first electrode plate 601 and an orthographic projection of the second electrode plate 603 on a display surface perpendicular to the OLED display panel can be adjusted, or a thickness of the dielectric layer 602 can be adjusted, or a dielectric constant of the dielectric layer 602 can be adjusted, so that the capacitance value of the first capacitor C1 affecting the light emission of the light-emitting device D in the sub-pixel circuit 10 is set differently.

Figure 7:
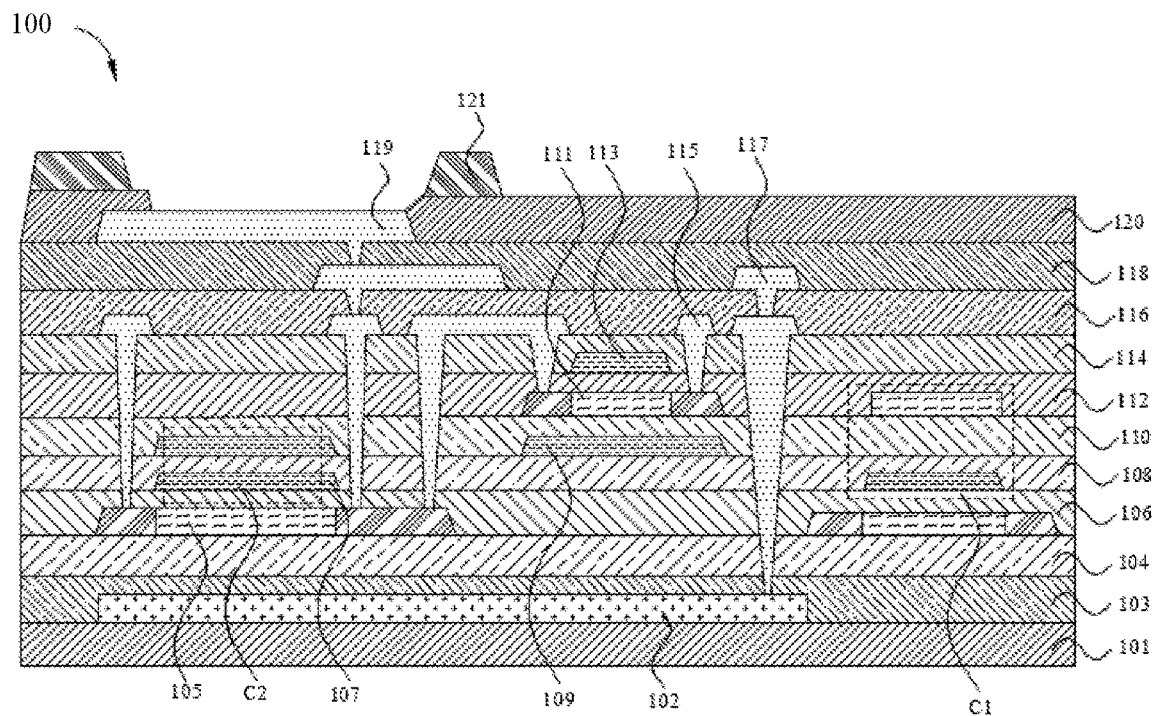
FIG. 7 is a schematic structural diagram of the OLED display panel provided by an embodiment of the present application.

Specifically, please refer to FIG. 7, which is a schematic structural diagram of the OLED display panel provided by the embodiment of the present application. Combined with FIG. 6 and FIG. 7, the OLED display panel [10] 100 comprises a substrate 101, a light-shielding metal layer 102, a first buffer layer 103, a second buffer layer 104, a first conductive channel layer 105, a first insulating layer 106, a first gate layer 107, a second insulating layer 108, a second gate layer 109, a third insulating layer 110, a second conductive channel layer 111, a fourth insulating layer 112, a third gate layer 113, a fifth insulating layer 114, a source and drain layer 115, a sixth insulating layer 116, a connection layer 117, a seventh insulating layer 118, an anode layer 119, a pixel definition layer 120, and a PS layer 121 stacked in sequence. Wherein the first gate layer 107 comprises a gate electrode and the first electrode plate, the dielectric layer comprises the second insulating layer 108 and the third insulating layer 110, and the second conductive channel layer 111 comprises conductive channels and the second electrode plate.

An overlapping area of the orthographic projections of the first electrode plate and the second electrode plate corresponding to the first capacitor C1 of the sub-pixel circuit of at least one color on the substrate 101 is different from an overlapping area of the orthographic projections of the first electrode plate and the second electrode plate of the sub-pixel circuit of another one color on the substrate 101.

An overlapping area of the orthographic projections of the first electrode plate and the second electrode plate corresponding to the first capacitor C1 corresponding to the red sub-pixel circuit on the substrate 101 is smaller than or equal to an overlapping area of the orthographic projections of the first electrode plate and the second electrode plate corresponding to the first capacitor C1 corresponding to the green sub-pixel circuit on the substrate 101. The overlapping area of the orthographic projections of the first electrode plate and the second electrode plate corresponding to the first capacitor C1 corresponding to the red sub-pixel circuit on the substrate 101 is larger than or equal to an overlapping area of the orthographic projections of the first electrode plate and the second electrode plate corresponding to the first capacitor C1 corresponding to the blue sub-pixel circuit on the substrate 101.

For example, line widths of the first electrode plate and the second electrode plate corresponding to the first capacitor C1 corresponding to the red sub-pixel circuit are smaller than or equal to line widths of the first electrode plate and the second electrode plate corresponding to the first capacitor C1 corresponding to the green sub-pixel circuit. The line widths of the first electrode plate and the second electrode plate corresponding to the first capacitor C1 corresponding to the red sub-pixel circuit are larger than or equal to line widths of the first electrode plate and the second electrode plate corresponding to the first capacitor C1 corresponding to the blue sub-pixel circuit.

Figure 8:
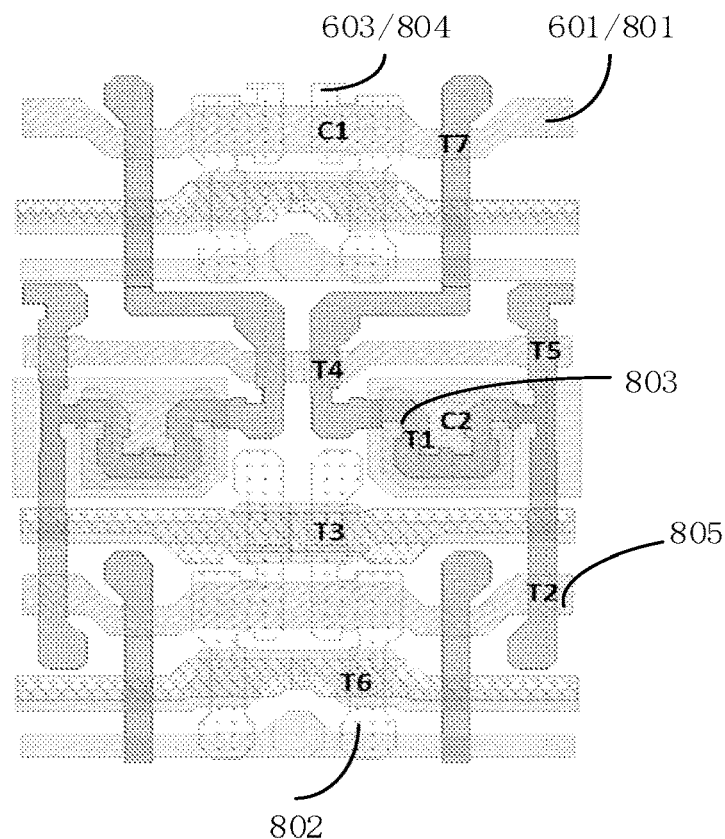
FIG. 8 is a schematic diagram of wiring of the sub-pixel circuit shown in FIG. 1.

Further, please refer to FIG. 8, FIG. 8 is a schematic diagram of wiring of the sub-pixel circuit shown in FIG. 1. Combined with FIG. 1 and FIG. 8, the first electrode plate 601 extends along a first direction, the second electrode plate 603 extends along a second direction, and the first direction intersects with the second direction. Both the first electrode plate 601 and the gate electrode of the seventh transistor T7 are first electrode block 801. Both one of the source electrode and the drain electrode of the third transistor T3 and another one of the source electrode and the drain electrode of the sixth transistor T6 are second electrode blocks 802. The gate electrode of the first transistor T1 is a third electrode block 803. The second electrode plate 603 is a fourth electrode block 804. The gate electrode of the second transistor T2 is a fifth electrode block 805.

The first electrode block 801 is electrically connected with the fifth electrode block 805, and the second electrode block 802, the third electrode block 803, and the fourth electrode block 804 are electrically connected. The first electrode block 801 and the fifth electrode block 805 are disposed at interval along the first direction, and the fourth electrode block 804 and the second electrode block 802 are disposed at interval along the first direction. The second electrode block 802 has a same shape as the fourth electrode block 804.

Specifically, in the embodiment of the present application, an overlapping area of the first electrode block 801 and the fourth electrode block can be adjusted, so that the capacitance values of the first capacitors C1 corresponding to different sub-pixels are different. That is, in the red sub-pixel circuit, the green sub-pixel circuit, and the blue sub-pixel circuit, the capacitance value of the first capacitor corresponding to the sub-pixel circuit of at least one color is different from the capacitance value of the first capacitor corresponding to the sub-pixel circuit of another one color, so that the capacitance value of the first capacitor corresponding to the green sub-pixel circuit is greatest; and/or, in the red sub-pixel circuit, the green sub-pixel circuit, and the blue sub-pixel circuit, the capacitance value of the first capacitor corresponding to the blue sub-pixel circuit is least, so as to prevent the light leakage phenomenon of the green sub-pixels under the black screen, and/or the blue sub-pixels can be made to reach the preset brightness in the high brightness screen, thereby improving the display quality of the OLED display panel.

The thickness of the dielectric layer 602 corresponding to the first capacitor C1 of the sub-pixel circuit of at least one color is different from the thickness of the dielectric layer 602 corresponding to the first capacitor C1 of the sub-pixel circuit of another one color.

For example, a thickness of the dielectric layer 602 corresponding to the first capacitor C1 corresponding to the red sub-pixel circuit is larger than or equal to a thickness of the dielectric layer 602 corresponding to the first capacitor C1 corresponding to the green sub-pixel circuit. The thickness of the dielectric layer 602 corresponding to the first capacitor C1 corresponding to the red sub-pixel circuit is smaller than or equal to a thickness of the dielectric layer 602 corresponding to the first capacitor C1 corresponding to the blue sub-pixel circuit.

The dielectric constant of the dielectric layer 602 corresponding to the first capacitor C1 corresponding to the sub-pixel circuit of at least one color is different from the dielectric constant of the dielectric layer 602 corresponding to the sub-pixel circuit of another one color.

For example, a dielectric constant of the dielectric layer 602 corresponding to the first capacitor C1 corresponding to the red sub-pixel circuit is smaller than or equal to a dielectric constant of the dielectric layer 602 corresponding to the first capacitor C1 corresponding to the green sub-pixel circuit. The dielectric constant of the dielectric layer 602 corresponding to the first capacitor C1 corresponding to the red sub-pixel circuit is larger than or equal to a dielectric constant of the dielectric layer 602 corresponding to the first capacitor C1 corresponding to the blue sub-pixel circuit.

In the OLED display panel provided by the present application, the capacitance value of the first capacitor C1 corresponding to the green sub-pixel circuit is greatest in the red sub-pixel circuit, the green sub-pixel circuit, and the blue sub-pixel circuit, and/or in the red sub-pixel circuit, the green sub-pixel circuit, and the blue sub-pixel circuit, the capacitance value of the first capacitor C1 corresponding to the blue sub-pixel circuit is least, so that the green sub-pixels are prevented from the light leakage phenomenon in the black screen, and/or the blue sub-pixel can be made to reach the preset brightness in the high brightness screen, thereby improving the display quality of the OLED display panel.

The principles and implementations of the present application are described herein using specific examples, and the descriptions of the above embodiments are only used to help understand the methods and core ideas of the present application; meanwhile, for those skilled in the art, according to the thoughts, there will be changes in specific embodiments and application scopes. To sum up, the contents of this specification should not be construed as limitation of the present invention.

What is claimed is:

1. An OLED display panel, comprising a plurality of sub-pixel circuits, the sub-pixel circuits configured to drive a light-emitting device to emit light; the plurality of sub-pixel circuits comprising red sub-pixel circuits, green sub-pixel circuits, and blue sub-pixel circuits;
wherein the sub-pixel circuit comprises a first transistor, a second transistor, a first capacitor, and a second capacitor; the first transistor is configured to control a current flowing through the light-emitting device; a first end of the first capacitor is electrically connected with a gate electrode of the first transistor, and a second end of the first capacitor is electrically connected with a first control signal terminal; a gate electrode of the second transistor is electrically connected with the first control signal terminal, one of a source electrode and a drain electrode of the second transistor is electrically connected with a data signal terminal, and another one of the source electrode and the drain electrode of the second transistor is electrically connected with one of a source electrode and a drain electrode of the first transistor; a first end of the second capacitor is electrically connected with a first power supply, and a second end of the second capacitor is electrically connected with the gate electrode of the first transistor;
in the red sub-pixel circuits, the green sub-pixel circuits, and the blue sub-pixel circuits, a capacitance value of the first capacitor corresponding to the sub-pixel circuit of at least one color is different from a capacitance value of the first capacitor corresponding to the sub-pixel circuit of another one color;
the first capacitor comprises a first electrode plate, a second electrode plate, and a dielectric layer disposed between the first electrode plate and the second electrode plate;
the OLED display panel comprises a substrate, a first conductive channel layer, a first insulating layer, a first gate layer, a second insulating layer, a second gate layer, a third insulating layer, and a second conductive channel layer which are stacked in sequence; and
the first gate layer comprises a gate electrode and the first electrode plate, the dielectric layer comprises the second insulating layer and the third insulating layer, and the second conductive channel layer comprises conductive channels and the second electrode plate.

2. The OLED display panel as claimed in claim 1, wherein an overlapping area of orthographic projections of the first electrode plate and the second electrode plate corresponding to the first capacitor corresponding to the sub-pixel circuit of at least one color on the substrate is different from an overlapping area of orthographic projections of the first electrode plate and the second electrode plate corresponding to the first capacitor corresponding to the sub-pixel circuit of another one color on the substrate.

3. The OLED display panel as claimed in claim 2, wherein an overlapping area of orthographic projections of the first electrode plate and the second electrode plate corresponding to the first capacitor corresponding to the red sub-pixel circuit on the substrate is smaller than or equal to an overlapping area of orthographic projections of the first electrode plate and the second electrode plate corresponding to the first capacitor corresponding to the green sub-pixel circuit on the substrate, and the overlapping area of the orthographic projections of the first electrode plate and the second electrode plate corresponding to the first capacitor corresponding to the red sub-pixel circuits on the substrate is larger than or equal to an overlapping area of orthographic projections of the first electrode plate and the second electrode plate corresponding to the first capacitor corresponding to the blue sub-pixel circuit on the substrate.

4. The OLED display panel as claimed in claim 3, wherein line widths of the first electrode plate and the second electrode plate corresponding to the first capacitor corresponding to the red sub-pixel circuit are smaller than or equal to line widths corresponding to the first electrode plate and the second electrode plate corresponding to the first capacitor corresponding to the green sub-pixel circuit; the line widths of the first electrode plate and the second electrode plate corresponding to the first capacitor corresponding to the red sub-pixel circuit are larger than or equal to line widths of the first electrode plate and the second electrode plate corresponding to the first capacitor corresponding to the blue sub-pixel circuit.

5. The OLED display panel as claimed in claim 4, wherein the sub-pixel circuit further comprises a third transistor, a fourth transistor, a fifth transistor, a sixth transistor, and a seventh transistor;
   a gate electrode of the third transistor is electrically connected with a second control signal terminal, one of a source electrode and a drain electrode of the third transistor is electrically connected with the gate electrode of the first transistor, and another one of the source electrode and the drain electrode of the third transistor is electrically connected with another one of the source electrode and the drain electrode of the first transistor;
   a gate electrode of the fourth transistor is electrically connected with a third control signal terminal, and one of a source electrode and a drain electrode of the fourth transistor is electrically connected with the first power supply, and another one of the source electrode and the drain electrode of the fourth transistor is electrically connected with one of the source electrode and the drain electrode of the first transistor;
   a gate electrode of the fifth transistor is electrically connected with the third control signal terminal, and one of a source electrode and a drain electrode of the fifth transistor connects with another one of the source electrode and the drain electrode of the first transistor, another one of the source electrode and the drain electrode of the fifth transistor is electrically connected with an anode of the light-emitting device, and a cathode of the light-emitting device is electrically connected with a second power supply;
   a gate electrode of the sixth transistor is electrically connected with a fourth control signal terminal, one of a source electrode and a drain electrode of the sixth transistor is electrically connected with a first initialization power supply, and another one of the source electrode and the drain electrode of the sixth transistor is electrically connected with the gate electrode of the first transistor;
   a gate electrode of the seventh transistor is electrically connected with the first control signal terminal, one of a source electrode and a drain electrode of the seventh transistor is electrically connected with a second initialization power supply, and another one of the source electrode and the drain electrode of the seventh transistor is electrically connected with the anode of the light-emitting device;
   wherein the first electrode plate extends along a first direction, the second electrode plate extends along a second direction, and the first direction intersects with the second direction;
   the first electrode plate and the electrode of the seventh transistor are both first electrode block, and one of the source electrode and the drain electrode of the third transistor and another one of the source electrode and the drain electrode of the sixth transistor are both second electrode block; the gate electrode of the first transistor is a third electrode block, the second electrode plate is a fourth electrode block, and the gate electrode of the second transistor is a fifth electrode block; and
   the first electrode block is electrically connected with the fifth electrode block, and the second electrode block, the third electrode block, and the fourth electrode block are electrically connected.

6. The OLED display panel as claimed in claim 5, wherein the first electrode block and the fifth electrode block are disposed at interval along the first direction, and the fourth electrode block and the second electrode block are disposed at interval along the first direction.

7. The OLED display panel as claimed in claim 6, wherein the second electrode block has a same shape as the fourth electrode block.

8. The OLED display panel as claimed in claim 1, wherein a thickness of the dielectric layer corresponding to the first capacitor corresponding to the sub-pixel circuit of at least one color is different from a thickness of the dielectric layer corresponding to the first capacitor corresponding to the sub-pixel circuit of another one color.

9. The OLED display panel as claimed in claim 8, wherein a thickness of the dielectric layer corresponding to the first capacitor corresponding to the red sub-pixel circuit is larger than or equal to a thickness of the dielectric layer corresponding to the first capacitor corresponding to the green sub-pixel circuit; the thickness of the dielectric layer corresponding to the first capacitor corresponding to the red sub-pixel circuit is smaller than or equal to a thickness of the dielectric layer corresponding to the first capacitor corresponding to the blue sub-pixel circuit.

10. The OLED display panel as claimed in claim 1, wherein a dielectric constant of the dielectric layer corresponding to the first capacitor corresponding to the sub-pixel circuit of at least one color is different from a dielectric constant of the dielectric layer corresponding to the first capacitor corresponding to the sub-pixel circuit of another one color.

11. The OLED display panel as claimed in claim 10, wherein a dielectric constant of the dielectric layer corresponding to the first capacitor corresponding to the red sub-pixel circuit is smaller than or equal to a dielectric constant of the dielectric layer corresponding to the first capacitor corresponding to the green sub-pixel circuit; the dielectric constant of the dielectric layer corresponding to the first capacitor corresponding to the red sub-pixel circuit is larger than or equal to a dielectric constant of the dielectric layer corresponding to the first capacitor corresponding to the blue sub-pixel circuit.

12. An OLED display panel, comprising a plurality of sub-pixel circuits, the sub-pixel circuit configured to drive a light-emitting device to emit light; the plurality of sub-pixel circuits comprising red sub-pixel circuits, green sub-pixel circuits, and blue sub-pixel circuits;

wherein the sub-pixel circuit comprises a first transistor, a second transistor, a first capacitor and a second capacitor; the first transistor is configured to control a current flowing through the light-emitting device; a first end of the first capacitor is electrically connected with a gate electrode of the first transistor; and a second end of the first capacitor is electrically connected with a first control signal terminal; a gate electrode of the second transistor is electrically connected with the first control signal terminal; one of a source electrode and a drain electrode of the second transistor is electrically connected with a data signal terminal; another one of the source electrode and the drain electrode of the second transistor is electrically connected with one of a source electrode and a drain electrode of the first transistor; a first end of the second capacitor is electrically connected with a first power supply, and a second end of the second capacitor is electrically connected with the gate electrode of the first transistor; and in the red sub-pixel circuits, the green sub-pixel circuits, and the blue sub-pixel circuits, a capacitance value of the first capacitor corresponding to the sub-pixel circuit of at least one color is different from the capacitance value of the first capacitor corresponding to the sub-pixel circuit of another one color;

a capacitance value of the first capacitor corresponding to the red sub-pixel circuit is smaller than or equal to a capacitance value of the first capacitor corresponding to the green sub-pixel circuit, and the capacitance value of the first capacitor corresponding to the red sub-pixel circuit is larger than or equal to a capacitance value of the first capacitor corresponding to the blue sub-pixel circuit; the first capacitor comprises a first electrode plate, a second electrode plate, and a dielectric layer disposed between the first electrode plate and the second electrode plate;

the OLED display panel comprises a substrate, a first conductive channel layer, a first insulating layer, a first gate layer, a second insulating layer, a second gate layer, a third insulating layer, and a second conductive channel layer which are stacked in sequence; and the first gate layer comprises a gate electrode and the first electrode plate, the dielectric layer comprises the second insulating layer and the third insulating layer, the second conductive channel layer comprises conductive channels and the second electrode plate.

13. The OLED display panel as claimed in claim 12, wherein an overlapping area of orthographic projection of the first electrode plate and the second electrode plate corresponding to the first capacitor corresponding to the sub-pixel circuit of at least one color on the substrate is different from an overlapping area of orthographic projections of the first electrode plate and the second electrode plate corresponding to the first capacitor corresponding to the sub-pixel circuit of another one color on the substrate.

14. The OLED display panel as claimed in claim 13, wherein an overlapping area of the orthographic projections of the first electrode plate and the second electrode plate corresponding to the first capacitor corresponding to the red sub-pixel circuit on the substrate is smaller than or equal to an overlapping area of the orthographic projections of the first electrode plate and the second electrode plate corresponding to the first capacitor corresponding to the green sub-pixel circuit on the substrate; and the overlapping area of the orthographic projections of the first electrode plate and the second electrode plate corresponding to the first capacitor corresponding to the red sub-pixel circuit on the substrate is larger than or equal to an overlapping area of the orthographic projections of the first electrode plate and the second electrode plate corresponding to the first capacitor corresponding to the blue sub-pixel circuit on the substrate.

15. The OLED display panel as claimed in claim 14, wherein line widths of the first electrode plate and the second electrode plate corresponding to the first capacitor corresponding to the red sub-pixel circuit are smaller than or equal to the line widths corresponding to the first electrode plate and the second electrode plate corresponding to the first capacitor corresponding to the green sub-pixel circuit; the line widths of the first electrode plate and the second electrode plate corresponding to the first capacitor corresponding to the red sub-pixel circuit are larger than or equal to the line widths of the first electrode plate and the second electrode plate corresponding to the first capacitor corresponding to the blue sub-pixel circuit.

16. The OLED display panel as claimed in claim 15, wherein the sub-pixel circuit further comprises a third transistor, a fourth transistor, a fifth transistor, a sixth transistor, and a seventh transistor;

a gate electrode of the third transistor is electrically connected with a second control signal terminal, one of a source electrode and a drain electrode of the third transistor is electrically connected with the gate electrode of the first transistor, and another one of the source electrode and the drain electrode of the third transistor is electrically connected with another one of the source electrode and the drain electrode of the first transistor;

a gate electrode of the fourth transistor is electrically connected with a third control signal terminal, and one of a source electrode and a drain electrode of the fourth transistor is electrically connected with the first power supply, and another one of the source electrode and the drain electrode of the fourth transistor is electrically connected with one of the source electrode and the drain electrode of the first transistor;

a gate electrode of the fifth transistor is electrically connected with the third control signal terminal, and one of a source electrode and a drain electrode of the fifth transistor connects with another one of the source electrode and the drain electrode of the first transistor, another one of the source electrode and drain electrode of the fifth transistor is electrically connected with an anode of the light-emitting device, and a cathode of the light-emitting device is electrically connected with a second power supply;

a gate electrode of the sixth transistor is electrically connected with a fourth control signal terminal, one of a source electrode and a drain electrode of the sixth transistor is electrically connected with a first initialization power supply, and another one of the source electrode and the drain electrode of the sixth transistor is electrically connected with the gate electrode of the first transistor;

a gate electrode of the seventh transistor is electrically connected with the first control signal terminal, one of a source electrode and a drain electrode of the seventh transistor is electrically connected with a second initialization power supply, and another one of the source electrode and the drain electrode of the seventh transistor is electrically connected with the anode of the light-emitting device;

wherein the first electrode plate extends along a first direction, the second electrode plate extends along a second direction, the first direction intersects with the second direction;

the first electrode plate and the gate electrode of the seventh transistor are both first electrode block, and one of the source electrode and the drain electrode of the third transistor and another one of the source electrode and drain electrode of the sixth transistor are both second electrode block, the gate electrode of the first transistor is third electrode block, the second electrode plate is a fourth electrode block, and the gate electrode of the second transistor is a fifth electrode block; and the first electrode block is electrically connected with the fifth electrode block, and the second electrode block, the third electrode block, and the fourth electrode block are electrically connected.

17. The OLED display panel as claimed in claim 16, wherein the first electrode block and the fifth electrode block are disposed at interval along the first direction, the fourth electrode block and the second electrode block are disposed at interval along the first direction.

18. The OLED display panel as claimed in claim 17, wherein the second electrode block has a same shape as the fourth electrode block.

\* \* \* \* \*